United States Patent [19]
Ryugo et al.

[11] 3,939,017
[45] Feb. 17, 1976

[54] PROCESS FOR DEPOSITING THE DEPOSITION AGENT ON THE SURFACE OF A NUMBER OF SEMICONDUCTOR SUBSTRATES

[75] Inventors: Noboru Ryugo; Keizo Inaniwa; Akira Sugiyama, all of Takasaki, Japan

[73] Assignee: Hitachi, Ltd., Japan

[22] Filed: Mar. 29, 1974

[21] Appl. No.: 456,291

[30] Foreign Application Priority Data
Apr. 2, 1973   Japan.................................. 48-36757

[52] U.S. Cl. ................. 148/189; 148/186; 148/187
[51] Int. Cl.² ......................................... H01L 7/44
[58] Field of Search................... 148/189, 187, 186

[56] References Cited
UNITED STATES PATENTS

| | | |
|---|---|---|
| 2,956,913 | 10/1960 | Mack et al...................... 148/189 X |
| 3,314,833 | 4/1967 | Arndt et al. ........................ 148/189 |
| 3,362,858 | 1/1968 | Knopp ........................... 148/189 X |
| 3,374,125 | 3/1968 | Goldsmith............................ 148/189 |
| 3,604,694 | 9/1971 | Muller ............................ 148/189 X |

*Primary Examiner*—G. Ozaki
*Attorney, Agent, or Firm*—Craig & Antonelli

[57] ABSTRACT

A novel process for depositing and diffusing an impurity on and into the surface of a number of semiconductor wafers placed in parallel on a quartz boat. The impurity source is formed as a plurality of long and slender bars or a unitary tunnel-shaped element or a plurality of tunnel segments obtained by cutting the element apart. The impurity source as described above is mounted about the periphery of the semiconductor wafers arranged in a row on a quartz boat for reducing the consumption of the impurity source.

14 Claims, 12 Drawing Figures

PROCESS FOR DEPOSITING THE DEPOSITION AGENT ON THE SURFACE OF A NUMBER OF SEMICONDUCTOR SUBSTRATES

DETAILED DESCRIPTION OF THE INVENTION

This invention relates to a process for depositing and diffusing an impurity on and into the semiconductor wafer.

When diffusing an impurity into a semiconductor wafer, as for instance when diffusing a p-type impurity into a silicon wafer by using boron nitride (BN) as an impurity source, wafers of boron nitride (BN) which were previously oxidized in an oxygen atmosphere for about 1 hour at 955°C. to form a boron oxide layer on the wafers, are placed as the p-type impurity source on a quartz boat in an alternate and aligned relation with the silicon wafers. The quartz boat is then inserted in a quartz tube which is heated from its peripheral side for generating the boron oxide atmosphere within the tube. The boron oxide is deposited on the silicon wafer in this manner for diffusing the impurity into the wafer. At this time, an atmosphere of an inert gas ($N_2$) is maintained within the tube which is then heated so that the boron oxide is deposited on the silicon wafer and the element boron is diffused into the surface of the semiconductor to a shallow depth.

With this previously developed process, it is necessary to provide the same number of boron nitride (BN) wafers as that of silicon wafers and provide each boron nitride wafer in juxtaposition to each one silicon wafer, which means a considerable labor and a reduction in the working efficiency. Moreover, because the silicon wafers and boron nitride (BN) wafers are placed alternately on the quartz boat, too much space is taken up by the boron nitride (BN) wafers, and only a limited number of silicon wafers can be placed at a time on the silicon boat. In addition, because each boron nitride wafer must be of substantially the same size as that of the silicon wafer, the consumption of boron nitride is naturally increased.

It is thus an object of the present invention to obviate this drawback in the previous process and to provide a process for positioning the impurity source in a confronting relation with the semiconductor wafers, in which the labor involved in the positioning operation may be considerably reduced.

It is another object of the present invention to increase markedly the number of semiconductor wafers to be processed at a time and reduce the deviation or variation in the amounts of the impurity to be doped into the semiconductor wafers.

These objects of the present invention may be attained in accordance with one preferred embodiment of the invention by an arrangement such that a plurality of semiconductor wafers are placed in a parallel relation on a quartz boat introduced into a tube maintained at the vacuum or reduced pressure, and the impurity is diffused into the semiconductor wafers from an impurity source arranged about the periphery of these wafers.

The present invention will be described in greater detail by reference to the accompanying drawings in which.

Figure 3A:
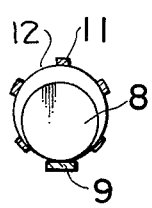
Figure 4A:
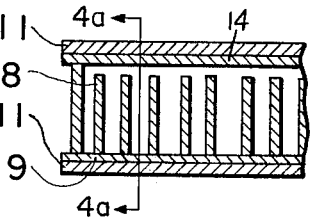
Figures 7A, 7B:
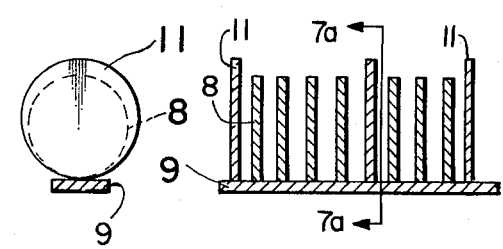

FIGS. 3(a) and (b) are the front and elevational views, respectively, of the semiconductor wafers and the impurity source utilized in one preferred embodiment of the inventive diffusion process; and, FIGS. 4(a) and (b) to FIGS. 7(a) and (b) are the front and elevational views, respectively, of the semiconductor wafers and the impurity source utilized in other embodiments of the inventive diffusion process.

Figure 1:
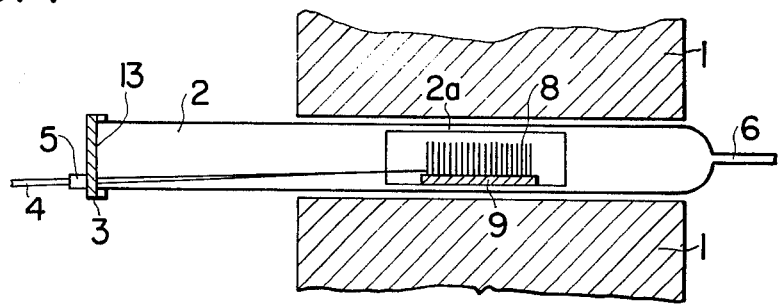
FIG. 1 is a partial sectional view of the diffusing apparatus.

FIG. 1 shows an apparatus used in the present process for diffusing an impurity into the semiconductor wafer. The reference numeral 1 in the drawing denotes a furnace having heating means, e.g., an electrical resistance heater into which is introduced a furnace tube 2 made of quartz, glass or silicon. A cap 3 is fitted removably to one end of the tube 2 and has an opening 5 in which is introduced a rod 4 for moving a boat to be described later. The other end of the tube 2 has an air discharge port 6 which is connected to a vacuum pump, not shown, for realizing a vacuum pressure inside the tube 2. The opening 5 is designated to be air-tight so that the outside air is prevented from entering tube 2 when the air is being discharged from the tube.

Figure 2:
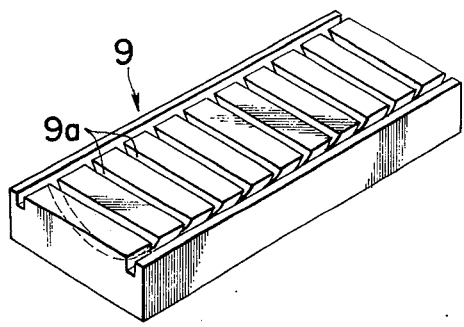
FIG. 2 is a perspective view of a boat for containing the wafers.

The boat 9 to be placed in the tube 2 of the above diffusion apparatus is made from quartz glass or silicon with an elongated shape. The upper surface of the boat 9 has a number of parallel transverse grooves 9a in which the silicon wafers 8 may be placed upright as shown in FIG. 2.

Figure 3B:
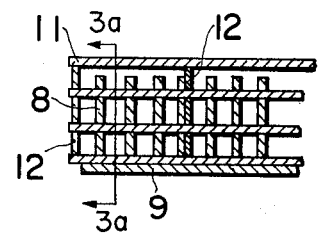

The tube 2 has a plurality of parallel arranged arcuate supports 12, each being a solid member, arranged on boat 9 so as to surround, but so as to be closely spaced from the silicon wafers 8, and the impurity sources 11 consisting of a plurality of long and slender bars 11 of boron nitride are placed around the periphery of the supports 12, as shown in FIGS. 3(a) and 3(b).

In the above construction of the diffusing apparatus, the silicon wafers 8 are placed in the grooves 9(a) of the boat 9 positioned in front of an opening 13 of the tube 2. The bars 11 of boron nitride (BN) are then placed on grooves and/or protrusions formed in or on the supports 12, from the outside of the silicon wafers positioned on the boat, and the opening 13 is closed with the cap 3. Thereafter, the air is discharged by means of a vacuum pump, not shown, from the air discharge port 6 provided on the opposite side of the closed opening 13, so that a vacuum or reduced pressure is now established within the tube 2. The boat 9 and boron nitride (BN) bars are then displaced to the central zone 2a of the tube 2 by pushing the rod 4 in order to perform the subsequent deposition and diffusing operations while the vacuum is maintained inside the tube 2. The deposition and diffusion process occurs in such a manner that the gaseous boron oxide ($B_2O_3$) impurity is generated as the boron nitride (BN) bars 11 are heated in the tube 2 to a temperature of from 850° to 1150°C. and the gaseous boron oxide so generated is deposited on and diffused into the main surface of the silicon wafer 8.

Upon completion of the deposition and diffusion process for the silicon wafers 8, the boat 9 is pulled towards the cap 3 of the tube 2 by manipulation of the rod 4 and, with the cap 3 removed, the boat 9 is taken out from the furnace.

In the foregoing embodiment, the silicon wafers 8 are introduced into a space defined by the peripheral boundary surface of the supports 12 on which an impurity source 11 consisting of a plurality of boron nitride (BN) bars is mounted.

Figure 4B:
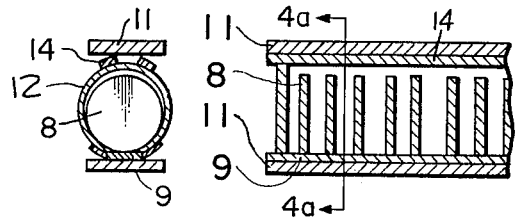

In a modified embodiment shown in FIGS. 4(a) and 4(b), the boron nitride (BN) impurity source 11 is formed as flat plates and spaced from the support 12 by a spacer 14 and the silicon wafers 8 placed on the boat 9 are introduced into the space defined by these flat plates to undergo the deposition and diffusion process. One of the boron nitride plates may be omitted, as the occasion may demand.

Figures 5A, 5B:
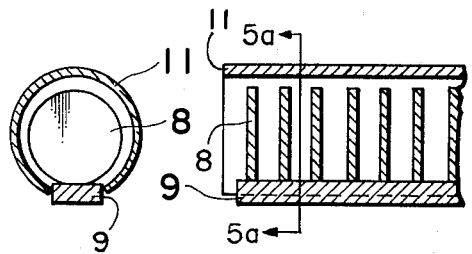

In a further modified embodiment shown in FIGS. 5(a) and 5(b), the boron nitride (BN) impurity source 11 is formed as an open partial cylinder or a tunnel-shaped element (which is placed in the tube 2). The silicon wafers 8 resting on the boat 9 are introduced into the tunnel-shaped element.

Figure 6A:
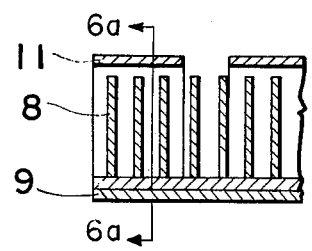
Figure 6B:
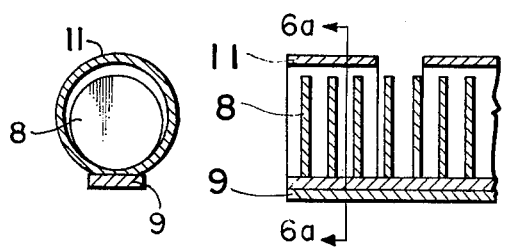

The tunnel-shaped element of the boron nitride (BN) impurity source 11 as shown in FIG. 5 may also be a cylinder cut into several juxtaposed segments, and the silicon wafers 8 placed on the boat 9 may be introduced into the tunnel-shaped spaces defined by these segments (see FIGS. 6(a) and 6(b)).

The boron nitride (BN) impurity source 11 may also be formed as discs placed on both ends and at some intermediate positions of the boat 9 on which the silicon wafers 8 are placed (see FIGS. 7(a) and 7(b)). In this embodiment, three or more wafers are interposed as a group between and closely adjacent to two discs 11.

While the boat 9 and the impurity source of boron nitride (BN) are inserted by operation of rod 4 as the vacuum pressure is maintained within the tube, substantially the same result may be attained by an alternative process in which the open end of the tube is closed with the cap after placing the boat 9 and the impurity source of boron nitride (BN) at the center of the tube and thereafter the air is discharged from the tube for performing the deposition and diffusion operations.

Furthermore, while the boat 9 and the impurity source 11 of boron nitride (BN) are moved together within the tube, a similar result may be attained by an alternative process in which the impurity source is placed in advance in the central zone of the quartz tube and the boat 9 by itself is inserted into and taken out of the tube for each deposition and diffusion operation.

Alternatively, the semiconductor wafer and the impurity source of boron nitride (BN) may be sealed in the quartz tube which is then introduced into the tube to be heated in the furnace.

As deposition agent, a solid deposition source such as ceramic containing a small quantity of boron oxide may be used effectively in consideration of its holding properties, besides the above-mentioned boron nitride (BN) containing a small quantity of boron oxide. Phosphorus oxide and other dopant oxides may also be used as deposition agents besides boron oxide.

According to the present invention, as described above, it is no longer necessary to provide an impurity source for each of the semiconductor wafers, and the labor necessary in positioning the impurity sources is considerably reduced. Moreover, there is no necessity of alternately positioning the semiconductor wafers and the impurity sources, and thus the number of the semiconductor wafers to be accommodated in one quartz boat may be markedly increased with consequent increase in the number of the wafers processed in one operation and reduction in the consumption of the impurity sources.

In the above-mentioned deposition process, a small quantity of boron atoms are diffused into the surface region of the semiconductor wafer. The deposited oxide layer is then removed and the semiconductor wafer is further heated so that the diffused layer of the predetermined depth and specific resistance may be obtained on the wafer surface.

It will be understood that the time for effecting heat-treatment of the impurity source and semiconductor wafers at 850° to 1150°C. in the furnace tube 2 may vary from about 10 to 120 minutes, and that a reduced pressure of from $10^{-1}$ to $10^2$ mmHg or a vacuum of $10^{-6}$ mmHg may be employed.

While the novel embodiments of the invention have been described, it will be understood that various omissions, modifications and changes in these embodiments may be made by one skilled in the art without departing from the spirit and scope of the invention.

What is claimed is:

1. A process for diffusing an impurity into a semiconductor wafer comprising:
    placing a plurality of semiconductor wafers upright on a boat,
    placing a plurality of impurity sources so as to surround and be closely spaced from said wafers,
    placing said boat into one end of an elongated tube,
    discharging air within said tube from the other end of said tube to thereby establish a vacuum or reduced air atmosphere in said tube, and
    heating said semiconductor wafers and impurity sources in said tube to thereby produce a gaseous oxide from said impurity within said tube and diffuse said impurity into said semiconductor wafers.

2. The process of claim 1, wherein said impurity sources are placed on said boat prior to placing said boat into said tube.

3. The process of claim 2, wherein said impurity sources are supported by and arranged longitudinally with respect to said boat.

4. The process of claim 3, wherein said impurity sources longitudinally extend past the plurality of semiconductor wafers arranged transversely with respect to said boat.

5. The process of claim 1, wherein said impurity sources are placed in said tube independently of said boat.

6. A process for diffusing an impurity into a semiconductor wafer comprising:
    placing a plurality of semiconductor wafers on a boat, said semiconductor wafers being arranged transversely with respect to the longitudinal direction of said boat,
    arranging a plurality of elongated impurity sources longitudinally with respect to said boat so that said impurity sources longitudinally extend past the outer peripheries of a plurality of semiconductor wafers, said impurity sources being closely spaced from the outer peripheries of said semiconductor wafers, said impurity sources being supported by said boat,
    placing said boat in an elongated tube, and
    heating said elongated tube to produce a gaseous oxide of said impurity within said tube and diffuse said impurity into said semiconductor wafers.

7. The process of claim 6 further comprising maintaining a reduced pressure or vacuum in said tube during heating.

8. The process of claim 7, wherein said tube is hermetically sealed during heating.

9. The process of claim 7, wherein said boat is placed into said elongated tube from one end thereof and further wherein air is withdrawn from said tube from the other end thereof.

10. The process of claim 7, wherein said boat includes support means for supporting said plurality of impurity sources.

11. The process of claim 10, wherein said impurity sources are in the form of spaced bars extending substantially parallel to each other and to the longitudinal axis of said tube.

12. The process of claim 10, wherein said plurality of impurity sources is composed of a tunnel-shaped element extending parallel to said tube.

13. The process of claim 6, wherein said impurity sources are in the form of spaced bars extending substantially parallel to each other and to the longitudinal axis of said tube.

14. The process of claim 6, wherein said plurality of impurity sources is composed of a tunnel-shaped element extending parallel to said tube.

* * * * *